(12) United States Patent
Miyako

(10) Patent No.: US 6,486,565 B2
(45) Date of Patent: Nov. 26, 2002

(54) SEMICONDUCTOR DEVICE

(75) Inventor: Satoyuki Miyako, Yokohama (JP)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 09/818,432

(22) Filed: Mar. 26, 2001

(65) Prior Publication Data
US 2001/0040301 A1 Nov. 15, 2001

(30) Foreign Application Priority Data
Mar. 27, 2000 (JP) .............................. 2000-087400

(51) Int. Cl.$^7$ .................... H01L 23/544; H01L 23/45
(52) U.S. Cl. .................. 257/797; 257/739; 257/748; 257/754; 257/773
(58) Field of Search ........................ 257/797, 739, 257/748, 754, 756, 776, 773, 775; 438/638, 618, 666, 630, 647, 655, 657, 401, 462, 978

(56) References Cited
U.S. PATENT DOCUMENTS 5,773,857 A * 6/1998 Ura ........................... 257/211
5,856,241 A * 1/1999 Narita ....................... 438/758
6,049,135 A * 4/2000 Koike ....................... 257/780

FOREIGN PATENT DOCUMENTS

JP      1-251631      10/1989
JP      2-58849    *   2/1990

* cited by examiner

Primary Examiner—Jasmine J B Clark
(74) Attorney, Agent, or Firm—Gray Cary Ware & Freidenrich LLP

(57) ABSTRACT

The dimension measurement and management of a mask or a wafer are facilitated by using a dummy pattern having a configuration and arrangement capable of achieving a plurality of objects. In the entire region or a major region of an optional wiring layer on a semiconductor chip and in the space between the adjacent patterns in an actual pattern portion, dummy patterns for controlling the coverage and density of a pattern in the wiring layer are regularly arranged. All or some of the dummy patterns are dummy patterns for the dimension measurement including the main size (width and distance) required for the dimension management of the wiring layer.

15 Claims, 3 Drawing Sheets

SEMICONDUCTOR DEVICE

CROSS-REFERENCE TO RELATED APPLICATIONS

This application is based upon and claims the benefit of priority from the prior Japanese Patent Application No. 2000-087400, filed Mar. 27, 2000, the entire contents of which are incorporated herein by reference.

BACKGROUND OF THE INVENTION

The present invention relates to a semiconductor device (LSI), particularly, to the arrangement and configuration of dummy patterns formed on a semiconductor chip and used in, for example, a logic LSI.

In manufacturing an LSI, it was customary in the past to perform the dimension measurement and management of a mask or a wafer by using dimension measurement marks as a substitute for an actual pattern, i.e., a pattern having a significance as the real circuit.

Also, with progress in the miniaturization of logic LSI products, it is absolutely necessary for the dimension measuring portions (mark positions) to be changed from the portions used in method (a) given below to the portions used in method (b) or (c) given below:

(a) Marks are arranged in the area where patterns are not substantially formed in order to enhance the visual recognition of the marks themselves. As a result, the marks are arranged in positions markedly differing from the actual pattern portions in the pattern density or covering rate.

(b) Marks are arranged in the vicinity of the actual pattern in order to avoid the problem that the marks widely differ from the actual pattern in the density and covering rate.

(c) The actual pattern itself is measured in place of measuring the marks used as a substitute for the actual pattern.

Since the pattern at a fixed portion on the wafer, i.e., the pattern present in the same position on the respective device, is not measured in, particularly, method (b) or (c), required is the specification for the pattern measurement such as drawings and coordination data for every device, with the result that considerable labor and time are consumed for the pattern measurement in accordance with the specification.

Also, in measuring the pattern, much labor is required because it is necessary to find the measuring portions in accordance with the specification. Further, since the required number of pattern measurements is increased with progress in the miniaturization technology, the required labor and time are also increased in accordance with the specification referred to above.

As described above, the problem is inherent in the conventional semiconductor device that, in manufacturing the products, considerable labor and time are required for the pattern measurement in accordance with the specification for the pattern measurement for every device.

BRIEF SUMMARY OF THE INVENTION

An object of the present invention, which has been achieved for overcoming the above-noted problems inherent in the prior art, is to provide a semiconductor device that permits facilitating the operation of dimension measurement and management of the mask or wafer by using a dummy pattern capable of achieving a plurality of objects.

According to a preferred embodiment of the present invention, there is provided a semiconductor device comprising dummy patterns regularly arranged in the entire region or a major portion of an optional wiring layer on a semiconductor chip for controlling the covering rate and the pattern density in the wiring layer in the space between adjacent patterns of the actual pattern, the dummy patterns including dummy patterns for the dimension measurement having dimensions required for the dimension management of the wiring layer and arranged regularly.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

A preferred embodiment of the present invention will now be described with reference to the accompanying drawings. The wiring layer formed on the semiconductor chip described in this specification includes wiring elements such as diffusion layers, polysilicon layers, metal layers, contacts connecting these wiring elements, or the like.

Figure 1:
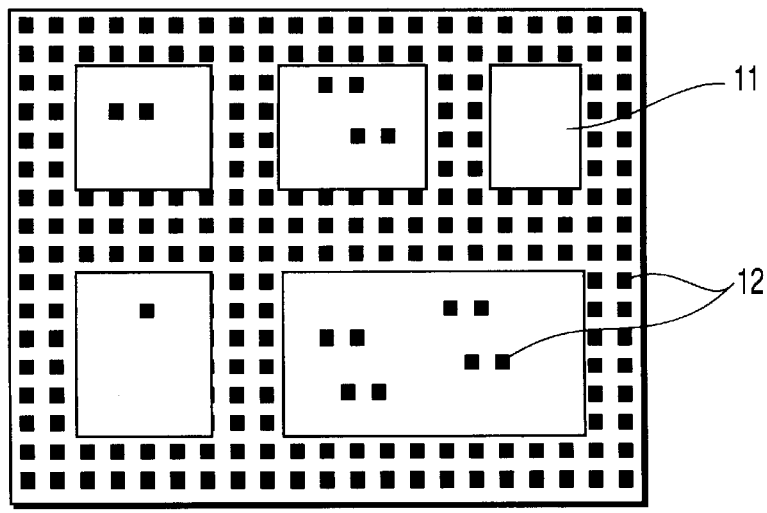
FIG. 1 schematically exemplifies the layout of a pattern on a logic LSI chip according to one embodiment of the present invention.

FIG. 1 schematically exemplifies the layout of a pattern on a logic LSI chip according to one embodiment of the present invention. Arranged on the LSI chip shown in FIG. 1 are circuit pattern portions 11 and dummy patterns 12 arranged in the entire region of an optional wiring layer or in a major portion excluding a part of the wiring layer for controlling the covering rate and the density of the pattern. The dummy patterns are regularly arranged in a space between adjacent patterns of the actual pattern portion, i.e., in a space between adjacent circuit pattern portions or in a space in the circuit pattern portion in which a problem is not generated in respect of the circuit operation. Also, all or some of the dummy patterns are dummy patterns for the dimension measurement including a configuration and arrangement having a main dimension required for the management of the dimension, i.e., the specified dimension (width and distance between adjacent patterns) that is important for the management of the dimension.

Figures 2, 3:
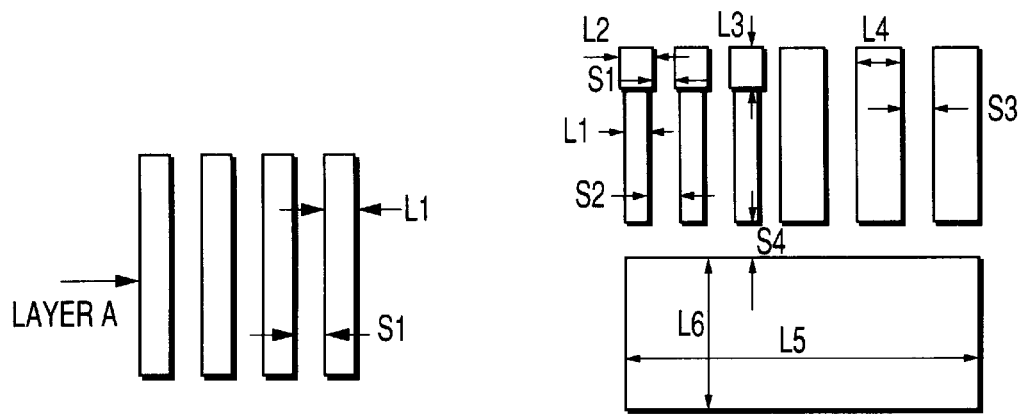
FIG. 2 exemplifies a basic dummy pattern as a dummy pattern for the dimension measurement included in the arrangement shown in FIG. 1.
FIG. 3 exemplifies a dummy pattern having at least one kind of polygon pattern as a dummy pattern for the dimension measurement included in the arrangement shown in FIG. 1.

FIG. 2 exemplifies a basic dummy pattern as a dummy pattern for the dimension measurement included in the arrangement shown in FIG. 1. In the dummy pattern, one kind of polygon patterns having a main width L1 and a distance S1 between adjacent patterns, which are required for the management of the dimension of the layer, are arranged to form a plurality of columns. Layer A shown in FIG. 2 corresponds to all the wiring layers requiring a dummy pattern. Only the dummy pattern for one layer is shown in FIG. 2.

To be more specific, according to the LSI shown in FIG. 1, it is possible to simplify the preparation of the specification relating to the dimension measurement and to facilitate the operation in the measuring step of the dimension (to find easily the pattern) by dispersing regularly a large number of basic dummy patterns as shown in, for example, FIG. 2 in a major portion of the region in which a problem in respect of the circuit operation is not generated inside the chip or in the entire region of the chip, thereby facilitating the dimension measurement and management of the mask and the wafer.

FIG. 3 exemplifies a dummy pattern having at least one kind of a polygon pattern as a dummy pattern for the dimension measurement included in the arrangement shown in FIG. 1.

The dummy pattern is arranged such that at least one kind of polygon patterns have at least one kind of dimensions including a width L1 and a distance S1 between adjacent patterns (width of L1, L2, L3, L4, L5, L6; distance of S1, S2, S3, S4). Incidentally, the number of polygon patterns present in the pattern and the number of dimension values (width and distance between adjacent patterns) are optional.

The dummy pattern shown in FIG. 3 produces the effect that the configuration and dimension of each pattern can be confirmed entirely because the dummy pattern has a plurality of pattern configurations and dimensions in addition to the effect produced in the case of using the basic pattern shown in FIG. 2 described above.

Figure 4:
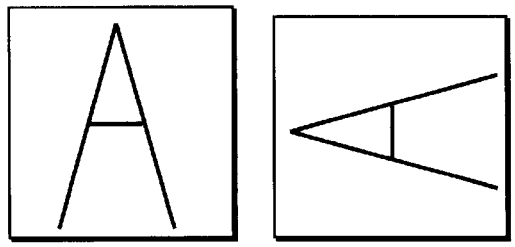
FIG. 4 exemplifies a dummy pattern having a plurality of patterns differing from each other in the direction of the arrangement as a dummy pattern for the dimension measurement included in the arrangement shown in FIG. 1.

FIG. 4 exemplifies a dummy pattern having a plurality of patterns differing from each other in the direction of the arrangement as a dummy pattern for the dimension measurement included in the arrangement shown in FIG. 1.

In the dummy pattern shown in FIG. 4, a pattern similar to that shown in FIG. 2 or FIG. 3, which is abbreviated as a letter "A", is arranged in the vicinity of the same pattern in a position rotated by 90° or 270°.

According to the dummy pattern shown in FIG. 4, where the object dimension or configuration including the width L1 and the distance S1 between the adjacent patterns within the pattern is formed in only one of the X-direction and the Y-direction, it is possible to form the object dimension or configuration including the width L1 and the distance S1 between adjacent patterns in the other direction, too, by arranging the same or similar pattern in a position rotated by 90° or 270°.

The dummy pattern shown in FIG. 4 produces the effect that the configuration and the dimension in both the X-direction and the Y-direction can be confirmed in addition to the effect produced in the case of using the dummy pattern shown in FIG. 2 or FIG. 3.

Figure 5:
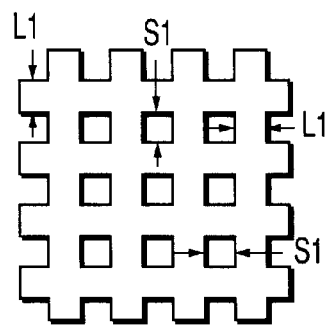
FIG. 5 exemplifies a dummy pattern in which the objecting dimension and configuration in the X-direction and Y-direction within a chip plane are included in a single pattern as a dummy pattern for the dimension measurement included in the arrangement shown in FIG. 1.

FIG. 5 exemplifies a dummy pattern in which the object dimension (including L1, S1) in both the X-direction and the Y-direction in the chip plane or the configuration is included in a single pattern as a dummy pattern for measuring the dimension included in the arrangement shown in FIG. 1.

Figure 6:
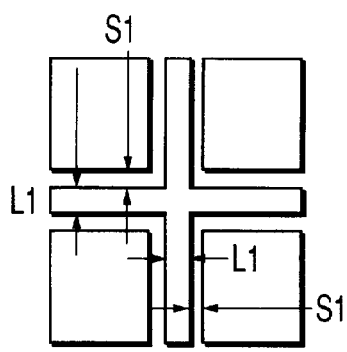
FIG. 6 shows another example of a dummy pattern in which the objecting dimension and configuration in the X-direction and Y-direction within a chip plane are included in a single pattern as a dummy pattern for the dimension measurement included in the arrangement shown in FIG. 1.

FIG. 6 exemplifies another dummy pattern in which the object dimension (including L1, S1) in both the X-direction and the Y-direction in the chip plane or the configuration is included in a single pattern as a dummy pattern for measuring the dimension included in the arrangement shown in FIG. 1.

Figure 7:
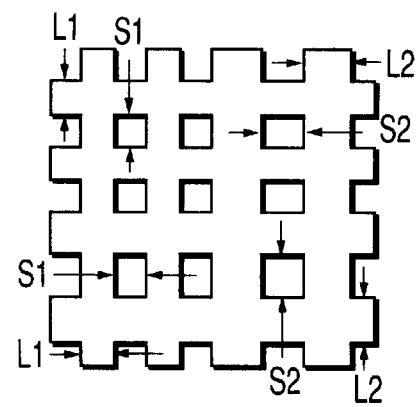
FIG. 7 exemplifies a dummy pattern having a significance of combination of the pattern shown in FIG. 3 and the pattern shown in FIG. 5 as a dummy pattern for the dimension measurement included in the arrangement shown in FIG. 1.

Further, FIG. 7 exemplifies a dummy pattern having a significance of the combination of the patterns shown in FIGS. 3 and 5 as a dummy pattern for measuring the dimension included in the arrangement shown in FIG. 1.

In the dummy patterns shown in the drawings, at least one kind of the dimension and configuration including L1 and S1 are formed in a single pattern, and has a dimension and configuration in both the X-direction and the Y-direction. Also, the number of polygon patterns present in the pattern and the values of the dimension (width and distance between adjacent patterns) are optional.

According to the dummy pattern shown in FIG. 5, FIG. 6 or FIG. 7, it is possible to obtain the effect of confirming the configuration and dimension in both the X-direction and the Y-direction in addition to the effect produced in the case of using the dummy patterns shown in FIGS. 2 and 3.

If the amount of data on a single dummy pattern is increased in each of the dummy patterns shown in FIGS. 2 to 7, the total amount of data is increased after arrangement of the dummy patterns on the entire chip. In order to avoid this difficulty, FIGS. 8 to 10 show examples in which dummy patterns for measuring the dimension are arranged in a part of a simple pattern group (block) having a small data size in place of using all the dummy patterns as the dummy patterns for measuring the dimension.

Figure 8:
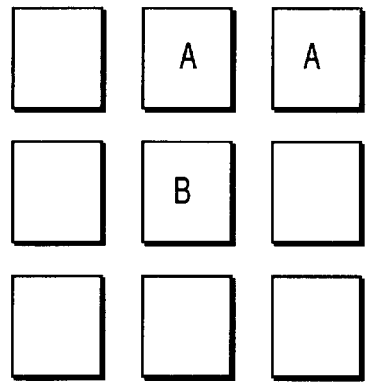
FIG. 8 exemplifies a dummy pattern consisting of a major portion of simple dummy patterns A and a dummy pattern B for the dimension measurement arranged in a center of the simple dummy pattern as a dummy pattern for the dimension measurement included in the arrangement shown in FIG. 1.

FIG. 8 exemplifies a dummy pattern comprising a major portion of simple dummy patterns and a dummy pattern for measuring the dimension arranged in a part as a dummy pattern for the dimension measurement included in the arrangement shown in FIG. 1. In the dummy pattern shown in FIG. 8, simple square dummy patterns A are arranged optionally or regularly and a dummy pattern B for the dimension measurement having L1 and S1, etc., which is one of the dummy patterns shown in FIGS. 2 to 7, is arranged in a part of the arrangement of the dummy patterns A. In this example, simple square dummy patterns A are arranged to form a rectangular frame, and the dummy pattern B for the dimension measurement is arranged in the center of the arrangement of the dummy patterns A. Since the dummy patterns are regularly arranged, the dummy patterns B for the dimension measurement are naturally arranged regularly in the center of the dummy pattern arrangement.

Figure 9:
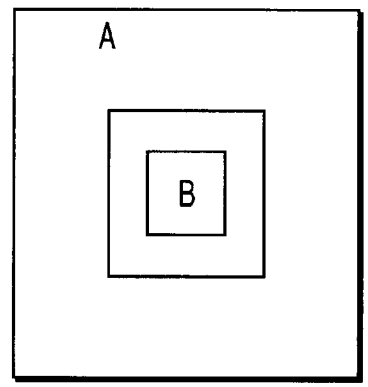
FIG. 9 shows another example of a dummy pattern consisting of a major portion of a simple dummy pattern A and a dummy pattern B for the dimension measurement arranged in a center of the simple dummy pattern as a dummy pattern for the dimension measurement included in the arrangement shown in FIG. 1.

FIG. 9 shows a modification of the dummy pattern shown in FIG. 8. In the dummy pattern shown in FIG. 9, a dummy pattern B for the dimension measurement is arranged in the center of a simple rectangular frame-like dummy pattern A.

Figure 10:
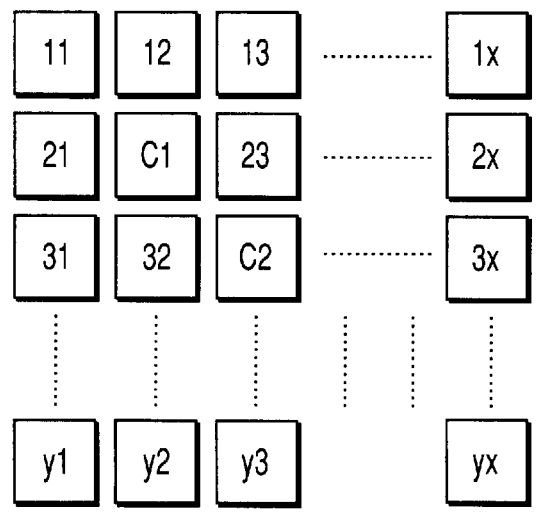
FIG. 10 exemplifies a dummy pattern consisting of a group of patterns in which a plurality of simple dummy patterns are arranged optionally or regularly and dummy patterns (C1, C2, . . . , Cm) for the dimension measurement arranged in a part of the group of patterns of the simple dummy patterns as a dummy pattern for the dimension measurement included in the arrangement shown in FIG. 1.

FIG. 10 exemplifies a dummy pattern, in which dummy patterns (C1, C2, . . . Cm) for the dimension measurement are substituted in parts of a pattern group formed by optionally or regularly arranging a plurality of simple dummy patterns (11 to 1x, . . . y1 to yx), as a dummy pattern for the dimension measurement included in the arrangement shown in FIG. 1. The dummy patterns (C1, C2, . . . , Cm) for the dimension measurement include at least one kind of the dummy patterns shown in FIGS. 2 to 9, and at least one dummy pattern is arranged. By regularly arranging these dummy patterns, the dummy patterns (C1, C2, . . . , Cm) for the dimension measurement are also arranged regularly.

The dummy patterns shown in FIGS. 8 to 10 produce the effects of suppressing the increase in the data amount by arranging the dummy patterns for the dimension measurement in a part of a simple pattern group having a small data size and of regularly inserting a large number of dummy patterns for the dimension measurement over the entire chip in addition to the effect produced in the case of using the dummy patterns shown in FIGS. 2 to 7.

Incidentally, the arrangement of at least two kinds of the dummy patterns shown in FIGS. 2 to 9 is effective for the precise inspection of the dimension when, for example, the yield is lowered.

If the minimum design rule dimensions or the limiting dimensions in the dummy patterns shown in FIGS. 2 to 9 are used as the specified dimensions important in the dimension management, it is possible to measure these dimensions so as to facilitate the practice of the specification accompanying the dimension measurement and the measuring operation. It is possible to manage at least two dimensions.

Figure 11A:
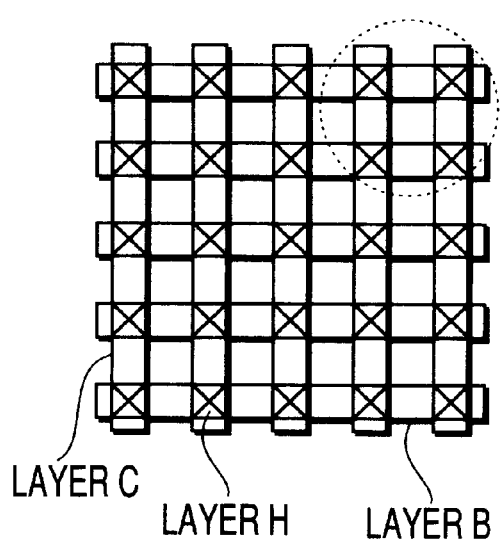
FIG. 11A exemplifies the arrangement in the case where at least two kinds of dummy patterns for the dimension measurement are arranged for the management of the dimension between wiring layers differing from each other.
Figure 11B:
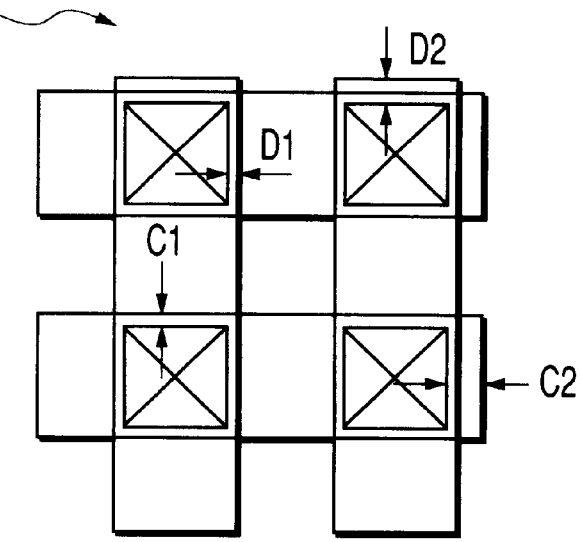
FIG. 11B shows in a magnified fashion a part of FIG. 11A.

FIGS. 11A and 11B show examples of the arrangement in the case where at least two kinds of the dummy patterns for the dimension measurement are arranged for the dimension management between the adjacent wiring layers differing from each other.

In FIG. 11A, each of layers B and C represents the wiring layer, with layer H representing a contact for connecting these layers B and C. Also, in FIG. 11B, each of C1 and D1 represents a coverage between the diffusion region and the contact or the coverage between the wiring and the contact.

On the other hand, each of C2 and D2 shown in FIG. 11B represents, for example, the dimension of the fringe, etc. of the wiring relative to the contact.

To be more specific, in the example of the arrangement of the dummy patterns for the dimension measurement shown in FIGS. 11A and 11B, at least two kinds of the dummy pattern layers for the dimension measurement have main dimensions required for the dimension management and the process management concerning the relationship between the different wiring layers. It should be noted that the relationship between the different wiring layers includes the coverage and fringe of the lower layer relative to the upper layer, and the coverage and fringe of the upper layer relative to the lower layer. On the other hand, the main dimension required for the dimension management includes the coverage and the fringe. Also, the dummy pattern for the dimension measurement has the minimum design rule dimension or the limiting dimension between the different wiring layers.

According to the construction described above, it is possible to confirm the design rule-like dimension or the cross section as the relationship between the different wiring layers, making it possible to perform the dimension management and the process management between the different wiring layers. It should also be noted that, since a large number of dummy patterns are regularly arranged on the entire chip surface or a major portion of the chip surface, it is possible to simplify the preparation of the specification data for the dimension measurement, to facilitate the operation for measuring the dimension, and to facilitate the process management such as the analysis of the cross section by SEM (Scanning Electron Microscopy).

Further, since the dummy patterns for the dimension measurement has the minimum design rule dimension or the limiting dimension between the different wiring layers, it is possible to measure and analyze the minimum design rule dimension and the limiting dimension so as to facilitate the specification and the measuring and analyzing operation.

Still further, by using the dummy patterns shown from FIG. 1 to FIG. 10 for each of the different wiring layers, it is possible to represent the significance as a single layer dummy pattern for the dimension measurement.

As described above, according to the semiconductor device of the present invention, it is possible to facilitate the dimension measurement and management of the mask or wafer by using a dummy pattern capable of achieving a plurality of objects.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising dummy patterns regularly arranged in the entire region or a major portion of an optional wiring layer on a semiconductor chip, said wiring layer including wiring elements which comprise diffusion layers, polysilicon layers, metal layers and contacts connecting said wiring elements, said dummy patterns controlling the covering rate and density of the pattern in the wiring layer in the space between adjacent patterns of the actual pattern, said dummy patterns including dummy patterns for the dimension measurement of said wiring elements, wherein each of said dummy patterns for the dimension measurement is formed of patterns of said wiring elements, including main dimensions required for the dimension management of said wiring layer and each of said dummy patterns for the dimension measurement is arranged regularly.

2. The semiconductor device according to claim 1, wherein said dummy pattern for the dimension measurement includes at least one kind of the dimension including said main dimension consisting of at least one kind of polygon pattern.

3. The semiconductor device according to claim 1, wherein said dummy pattern for the dimension measurement is formed to have the object dimension and configuration including said main dimension in only one of an X-direction and a Y-direction on a chip plane and a dummy pattern for the dimension measurement equal or similar to said dummy pattern for the dimension measurement rotated by 90° or 270° is arranged on the same wiring layer.

4. The semiconductor device according to claim 1, wherein said dummy pattern for the dimension measurement has an object dimension and configuration including said main dimension in both an X-direction and a Y-direction on a chip plane.

5. The semiconductor device according to claim 1, wherein said dummy pattern for the dimension measurement has the minimum design rule dimension or a limiting dimension of said wiring layer.

6. The semiconductor device according to claim 1, wherein said dummy pattern for the dimension measurement is arranged in the entire region or the major portion of the optional wiring layer on said semiconductor chip.

7. The semiconductor device according to claim 2, wherein said dummy pattern for the dimension measurement is formed to have the object dimension and configuration including said main dimension in only one of an X-direction and a Y-direction on a chip plane and a dummy pattern for the dimension measurement equal or similar to said dummy pattern for the dimension measurement rotated by 90° or 270° is arranged on the same wiring layer.

8. The semiconductor device according to claim 2, wherein said dummy pattern for the dimension measurement has an object dimension and configuration including said main dimension in both an X-direction and a Y-direction on a chip plane.

9. A semiconductor device comprising dummy patterns for the dimension measurement substituted in a part of the arrangement of a plurality of dummy patterns on a semiconductor chip, said dummy patterns being regularly arranged in the space between the adjacent patterns of an actual pattern portion of an optional wiring layer on a semiconductor chip, said wiring layer including wiring elements which comprise diffusion layers, polysilicon layers, metal layers and contacts connecting the wiring elements;

wherein said dummy patterns serve to control the covering rate and density of the pattern in the wiring layer on a semiconductor chip, and said dummy patterns for the dimension measurement is formed of patterns of said wiring elements, including the main dimensions required for the dimension management of said wiring layer; and at least one kind and at least one of said dummy patterns for the dimension measurement is substituted in a part of the arrangement of said dummy patterns.

10. The semiconductor device according to claim 9, wherein said dummy patterns are arranged in an X-direction and a Y-direction to form a rectangular configuration.

11. The semiconductor device according to claim 9, wherein said dummy pattern for the dimension measurement includes at least two kinds of layers of dummy patterns for the dimension measurement used for the dimension management between the wiring layers differing from each other.

12. The semiconductor device according to claim 11, wherein said at least two kinds of layers of the dummy patterns for the dimension measurement are for measuring the coverage and fringe of the lower layer relative to the upper layer between the wiring layers differing from each other or for measuring the coverage and fringe of the upper layer relative to the lower layer.

13. A semiconductor device, comprising dummy patterns for the dimension measurement substituted in a part of a dummy pattern arrangement on a semiconductor chip, said dummy patterns being regularly arranged in the space between the adjacent patterns of an actual pattern portion of an optional wiring layer on a semiconductor chip, said wiring layer including wiring elements which comprise diffusion layers, polysilicon layers, metal layers and contacts connecting the wiring elements;

wherein said dummy patterns serve to control the covering rate and density of the pattern in the wiring layer on a semiconductor chip, and said dummy patterns for the dimension measurement is formed of patterns of said wiring elements, including the main dimension required for the dimension management of said wiring layer; and said dummy pattern for the dimension measurement is arranged in the central portion of a singe rectangular frame-like dummy pattern or in the central portion of a rectangular frame-like arrangement consisting of a plurality of dummy patterns.

14. The semiconductor device according to claim 13, wherein said dummy pattern for the dimension measurement includes at least two kinds of layers of dummy patterns for the dimension measurement used for the dimension management between the wiring layers differing from each other.

15. The semiconductor device according to claim 14, wherein said at least two kinds of layers of the dummy patterns for the dimension measurement are for measuring the coverage and fringe of the lower layer relative to the upper layer between the wiring layers differing from each other or for measuring the coverage and fringe of the upper layer relative to the lower layer.

* * * * *